United States Patent
Tokuda

(10) Patent No.: US 12,273,077 B2
(45) Date of Patent: Apr. 8, 2025

(54) LOAD DETECTION CIRCUIT AND AMPLIFIER CIRCUIT

(71) Applicant: Murata Manufacturing Co., Ltd., Kyoto (JP)

(72) Inventor: Ikumi Tokuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 836 days.

(21) Appl. No.: 17/242,474

(22) Filed: Apr. 28, 2021

(65) Prior Publication Data

US 2021/0344307 A1 Nov. 4, 2021

(30) Foreign Application Priority Data

Apr. 30, 2020 (JP) ................... 2020-080300

(51) Int. Cl.
| | | |
|---|---|---|
| H03F 1/52 | (2006.01) | |
| H03F 1/56 | (2006.01) | |
| H03F 3/195 | (2006.01) | |

(52) U.S. Cl.
CPC ............. *H03F 1/565* (2013.01); *H03F 3/195* (2013.01); *H03F 2200/105* (2013.01); *H03F 2200/318* (2013.01); *H03F 2200/423* (2013.01); *H03F 2200/451* (2013.01)

(58) Field of Classification Search
CPC ........................................................ H03F 1/52
USPC ............................................. 330/298, 207 P
See application file for complete search history.

(56) References Cited

U.S. PATENT DOCUMENTS

| | | | | |
|---|---|---|---|---|
| 5,266,926 | A | * 11/1993 | Beigel ................. | G06K 7/0008 340/572.1 |
| 7,630,220 | B2 | * 12/2009 | Kotani ............... | H02M 3/3372 363/25 |
| 7,872,528 | B2 | * 1/2011 | Bockelman ......... | H03F 3/45475 330/149 |
| 2004/0056733 | A1 | 3/2004 | Park | |
| 2004/0070453 | A1 | 4/2004 | Dupuis et al. | |
| 2007/0069820 | A1 | * 3/2007 | Hayata ................. | H03F 3/68 330/298 |
| 2009/0289717 | A1 | 11/2009 | Tanaka et al. | |
| 2012/0229228 | A1 | 9/2012 | White | |

FOREIGN PATENT DOCUMENTS

| | | |
|---|---|---|
| JP | 2004-112810 A | 4/2004 |
| JP | 2007-096585 A | 4/2007 |
| JP | 5131540 B2 | 1/2013 |
| JP | 2013-183351 A | 9/2013 |
| KR | 10-2005-0024515 A | 3/2005 |
| WO | 2008/143124 A1 | 11/2008 |

* cited by examiner

*Primary Examiner* — Henry Choe
(74) *Attorney, Agent, or Firm* — MCDONALD HOPKINS LLC

(57) ABSTRACT

A load detection circuit includes a first detection part and a second detection part. The first detection part includes a first capacitor and a second capacitor, forms capacitive coupling with a signal transmission line connecting an output port of an RF amplifier and a load, and outputs a first signal. The second detection part includes a first inductor and a second inductor, forms inductive coupling with the signal transmission line, and outputs a second signal.

17 Claims, 5 Drawing Sheets

LOAD DETECTION CIRCUIT AND AMPLIFIER CIRCUIT

CROSS REFERENCE TO RELATED APPLICATION

This application claims priority from Japanese Patent Application No. 2020-080300 filed on Apr. 30, 2020. The content of this application is incorporated herein by reference in its entirety.

BACKGROUND OF THE DISCLOSURE

1. Field of the Disclosure

The present disclosure relates to a load detection circuit that detects a load impedance of an amplifier and an amplifier circuit including this load detection circuit.

2. Description of the Related Art

Japanese Unexamined Patent Application Publication No. 2004-112810 describes a matching circuit connected between a power amplifier circuit and an output load. The matching circuit adjusts a load impedance looking from the power amplifier circuit into an output load side.

BRIEF SUMMARY OF THE DISCLOSURE

However, unless the load impedance looking from the power amplifier circuit into the output load side is accurately detected, the matching circuit cannot be adjusted properly. Particularly, in the case where the output load varies, it is desirable to properly adjust the matching circuit depending on the load impedance for the output load.

Accordingly, an object of the present disclosure is to accurately detect the load impedance looking from a power amplifier (amplifier) into a load.

A load detection circuit according to a preferred embodiment of the present disclosure includes a first detection part and a second detection part. The first detection part forms capacitive coupling with a signal transmission line connecting an output port of a RF amplifier and a load and outputs a first signal. The second detection part forms inductive coupling with the signal transmission line and outputs a second signal.

In this configuration, the first signal and the second signal reflect the characteristics of an RF signal outputted from the RF amplifier. Specifically, the first signal and the second signal reflect the voltage amplitude and the current amplitude of an RF signal, respectively. Accordingly, it becomes possible to calculate the impedance (load impedance) looking from the RF amplifier into the load side by using the first signal and the second signal. Other features, elements, the characteristics and advantages of the present disclosure will become more apparent from the following detailed description of preferred embodiments of the present disclosure with reference to the attached drawings.

DETAILED DESCRIPTION OF THE DISCLOSURE

First Embodiment

A load detection circuit and an amplifier circuit according to the first embodiment of the present disclosure are described with reference to the drawings.

Load Detection Circuit

Figure 1:
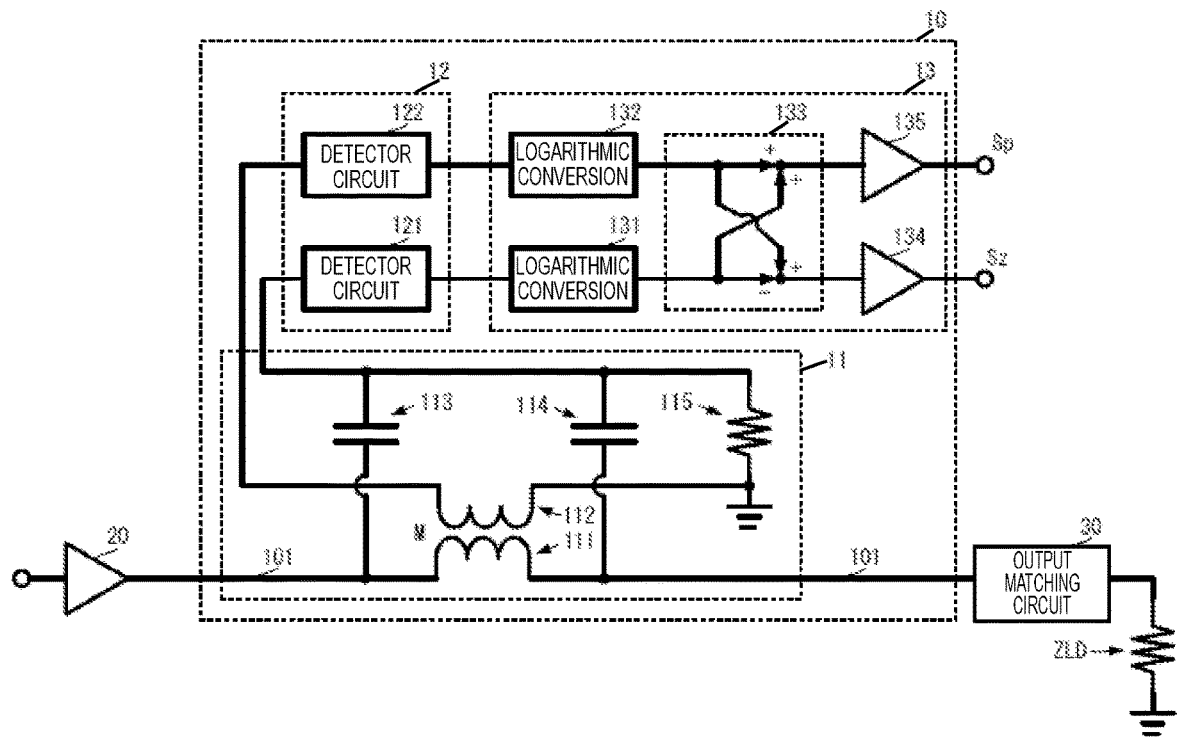
FIG. 1 is an equivalent circuit diagram of a load detection circuit according to a first embodiment.

FIG. 1 is an equivalent circuit diagram of a load detection circuit according to the first embodiment. As illustrated in FIG. 1, a load detection circuit 10 is connected between a RF amplifier 20 and an output matching circuit 30. That is to say, an output port of the RF amplifier 20 is connected to the load detection circuit 10, and the load detection circuit 10 is connected to the output matching circuit 30. The output matching circuit 30 is connected to a load ZLD. Hereinafter, the impedance looking from the RF amplifier 20 into a load ZLD side is referred to as a load impedance.

The load ZLD is, for example, an RF signal antenna. Note that the load ZLD is not limited to the antenna. The RF amplifier 20, the load detection circuit 10 and the output matching circuit 30 are each realized, for example, by using an insulating substrate on which conductor patterns are formed, semiconductor devices or chip-type electronic components mounted on the insulating substrate, passive devices formed on the insulating substrate, and the like.

The load detection circuit 10 includes a detection part 11, a detector part 12, and an arithmetic part 13. The detection part 11 includes an inductor 111, an inductor 112, a capacitor 113, a capacitor 114, and a resistor 115.

The inductor 111 and the inductor 112 form an inductive coupling in such a manner as to have a mutual inductance M. The inductor 111 and the inductor 112 are each realized, for example, by a transformer of a conductor pattern formed on the insulating substrate. A "second detection part" of the present disclosure is realized by the inductor 111 and the inductor 112. Note that the formation configuration of each of the inductor 111 and the conductor 112 is not limited to the one described above. For example, in the case where the substrate is formed from a semiconductor substrate or in any other similar cases, the inductor 111 and the inductor 112 may each be realized by a chip component type transformer.

The inductor 111 is connected between the output port of the RF amplifier 20 and the output matching circuit 30. In other words, one end portion of the inductor 111 is connected to the output port of the RF amplifier 20 via part of a signal transmission line 101 for RF signal on a RF amplifier 20 side. The other end portion of the inductor 111 is connected to the output matching circuit 30 via part of the signal transmission line 101 for RF signal on an output matching circuit 30 side.

One end portion of the inductor 112 is connected to the detector part 12. The other end portion of the inductor 112 is connected to a reference potential.

According to such configuration, a part made up of the inductor 111 and the inductor 112 (second detection part) outputs a second detection signal to the detector part 12 from the signal transmission line 101 by inductive coupling. The second detection signal reflects the current amplitude of an RF signal outputted from the RF amplifier 20.

One end portion of the capacitor 113 is connected to a part of the signal transmission line 101 where the output port of the RF amplifier 20 and the inductor 111 are connected. One end portion of the capacitor 114 is connected to a part of the signal transmission line 101 where the inductor 111 and the output matching circuit 30 are connected. The other end portion of the capacitor 113 and the other end portion of the capacitor 114 are connected to each other, and these other end portions are connected to the detector part 12 and to the reference potential via the resistor 115.

The capacitor 113 and the capacitor 114 are each realized, for example, by conductor patterns formed on the insulating substrate. Note that the formation configuration of each of the capacitor 113 and the capacitor 114 is not limited to the one described above. For example, in the case where the substrate is formed from a semiconductor substrate or in any other similar cases, the capacitor 113 and the capacitor 114 may each be realized by a chip component type capacitor, or more specifically, by a MIM capacitor. A "first detection part" of the present disclosure is realized by the capacitor 113 and the capacitor 114.

According to such configuration, a part (first detection part) made up of the capacitor 113 and the capacitor 114 outputs a first detection signal to the detector part 12 from the signal transmission line 101 by capacitive coupling. The first detection signal reflects the voltage amplitude of an RF signal outputted from the RF amplifier 20.

It is preferable that the line connecting the capacitor 113 and the capacitor 114 is sufficiently shorter than the wavelength of an RF signal (wavelength of the first detection signal). This enables to shorten the phase difference between the first detection signal outputted from the capacitor 113 and the first detection signal outputted from the capacitor 114. Accordingly, the characteristics of an RF signal can be accurately reflected in the characteristics of the first detection signal inputted to the detector part 12. Note that this detection part (first detection part) may include only one of the capacitor 113 and the capacitor 114 or may be made up of three or more capacitors. The number of the capacitors may be arbitrary set depending on a desired magnitude of capacitive coupling. For example, the number of capacitors and the capacitances of the capacitors may be set in such a way that for an RF signal, the magnitude of the inductive coupling in the second detection part is substantially equal to the magnitude of the capacitive coupling in the first detection part.

The resistor 115 functions as a terminal device for capacitive coupling. Note that the resistor 115 may be replaced with another terminal impedance device.

The detector part 12 includes a detector circuit 121 and a detector circuit 122. The detector circuit 122 is connected to the inductor 112. The detector circuit 121 is connected to the capacitor 113 and the capacitor 114. This causes the first detection signal to be inputted to the detector circuit 121. The second detection signal is inputted to the detector circuit 122.

The detector circuit 121 and the detector circuit 122 are each, for example, a circuit that carries out an envelope detection. The detector circuit 121 detects the first detection signal and outputs a first detector signal. The detector circuit 122 detects the second detection signal and outputs a second detector signal.

The arithmetic part 13 includes a logarithmic converter 131, a logarithmic converter 132, an adder-subtractor 133, an amplifier 134, and an amplifier 135. The logarithmic converter 131 and the logarithmic converter 132 are connected to the input ports of the adder-subtractor 133, and the output ports of the adder-subtractor 133 are connected to the amplifier 134 and the amplifier 135.

The logarithmic converter 131 is connected to the detector circuit 121. The logarithmic converter 131 logarithmically converts the amplitude of the first detector signal and generates a first logarithmic signal. The logarithmic converter 131 outputs the first logarithmic signal to the adder-subtractor 133. The logarithmic converter 132 is connected to the detector circuit 122. The logarithmic converter 132 logarithmically converts the amplitude of the second detector signal and generates a second logarithmic signal. The logarithmic converter 132 outputs the second logarithmic signal to the adder-subtractor 133.

The adder-subtractor 133 performs a subtraction operation on the second logarithmic signal and the first logarithmic signal. Specifically, in the present embodiment, the adder-subtractor 133 subtracts the first logarithmic signal from the second logarithmic signal. Note that the adder-subtractor 133 may subtract the second logarithmic signal from the first logarithmic signal. As described above, the first detection signal, from which the first logarithmic signal is derived, reflects the voltage amplitude of an RF signal, and the second detection signal, from which the second logarithmic signal is derived, reflects the current amplitude of the RF signal. Accordingly, a signal obtained by performing the subtraction operation on the second logarithmic signal and the first logarithmic signal reflects the load impedance for the RF signal. That is to say, the signal obtained by performing the subtraction operation on the second logarithmic signal and the first logarithmic signal is a load impedance detection signal Sz.

The adder-subtractor 133 outputs the load impedance detection signal Sz to the amplifier 134. The amplifier 134 amplifies the load impedance detection signal Sz by a factor of a predetermined amplification and outputs an amplified signal. Note that the amplifier 134 may be omitted.

The adder-subtractor 133 adds the first logarithmic signal and the second logarithmic signal together. As described above, the first detection signal, from which the first logarithmic signal is derived, reflects the voltage amplitude of an RF signal, and the second detection signal, from which the second logarithmic signal is derived, reflects the current amplitude of the RF signal. Accordingly, a signal obtained by adding the second logarithmic signal and the first logarithmic signal together reflects the power of the RF signal. That is to say, the signal obtained by adding the second logarithmic signal and the first logarithmic signal together is a power detection signal Sp.

The adder-subtractor 133 outputs the power detection signal Sp to the amplifier 135. The amplifier 135 amplifies the power detection signal Sp by a predetermined amplification factor and outputs an amplified signal. Note that the amplifier 135 may be omitted.

As described above, the load impedance detection signal Sz is generated by reflecting the voltage amplitude and the current amplitude of the detected RF signal, and thus the load impedance detection signal Sz accurately reflects the load impedance. Accordingly, the load detection circuit 10 can accurately detect the load impedance. Similarly, the power detection signal Sp is generated by using the voltage amplitude and the current amplitude of the detected RF signal, and thus the power detection signal Sp accurately reflects the power of the RF signal. Accordingly, the load detection circuit 10 can accurately detect the output power of an RF signal.

For example, in the case where a directional coupler is used to detect a load impedance instead of the configuration of the present disclosure, the load impedance detection signal cannot be detected directly. Accordingly, in the case where a directional coupler is used, the load impedance can only be detected indirectly by detecting whether or not an overload state is reached based on a power detection signal outputted from the directional coupler.

On the other hand, the load detection circuit according to the present disclosure enables to directly detect the load impedance detection signal separately from the power detection signal. Accordingly, compared with the case where a directional coupler is used to detect the load impedance, the load impedance can be detected accurately.

The load detection circuit 10 includes the logarithmic converter 131 and the logarithmic converter 132. This enables the load detection circuit 10 to generate the load impedance detection signal Sz using a simple subtraction operation that can be easily implemented by a circuit configuration or a program without using a division operation or the like, which uses a complex circuit configuration or a complex program. Furthermore, the use of the logarithmic converter 131 and the logarithmic converter 132 enables the load detection circuit 10 to generate the load impedance detection signal Sz more quantitatively and more accurately.

The load detection circuit 10 can convert a signal, which is used for generating the load impedance detection signal Sz, into a signal closer to DC by using the detector circuit 121 and the detector circuit 122. Furthermore, the load detection circuit 10 can suppress the noise of the signal used for generating the load impedance detection signal Sz. This enables the load detection circuit 10 to generate the load impedance detection signal Sz with more stability and higher accuracy.

Note that the load detection circuit 10 described above generates the power detection signal Sp as well as the load impedance detection signal Sz. However, in the case where only the load impedance detection signal Sz is to be generated, the load detection circuit 10 may include a subtractor instead of the adder-subtractor 133. Note that the generation of the power detection signal Sp enables a control part, which will be described below, to perform various controls more properly.

The load detection circuit 10 having such configuration is used, for example, in an amplifier circuit illustrated below.

Amplifier Circuit

Figure 2:
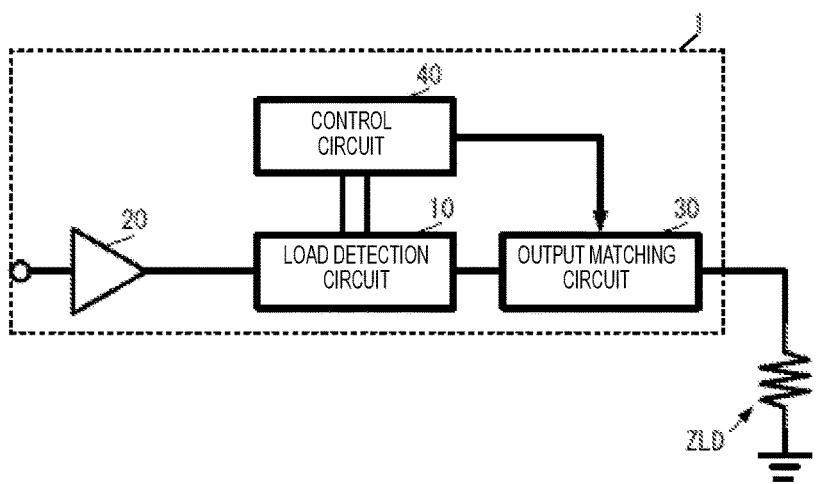
FIG. 2 is an equivalent circuit diagram of an amplifier circuit according to the first embodiment.

FIG. 2 is an equivalent circuit diagram of an amplifier circuit according to the first embodiment. As illustrated in FIG. 2, the amplifier circuit 1 includes the load detection circuit 10, the RF amplifier 20, the output matching circuit 30, and a control circuit 40. The load detection circuit 10, the RF amplifier 20, and the output matching circuit 30 are the ones described above, and thus specific descriptions are omitted.

The control circuit 40 is realized by an IC, a microcomputer, or the like. The control circuit 40 is connected to the load detection circuit 10 and the output matching circuit 30. The load impedance detection signal Sz and the power detection signal Sp are inputted to the control circuit 40 from the load detection circuit 10. Note that it is only necessary to input at least the load impedance detection signal Sz to the control circuit 40.

The control circuit 40 controls the impedance of the output matching circuit 30 using the load impedance detection signal Sz. For example, the control circuit 40 acquires the load impedance detection signal Sz at predetermined sampling intervals and detects variations in load impedance. The control circuit 40 adjusts the impedance of the output matching circuit 30 depending on the variation in load impedance. This enables the amplifier circuit 1 to accurately compensate the variation in load impedance.

This stabilizes the impedance matching between the RF amplifier 20 and the load ZLD and enables to, for example, suppress the degradation of the characteristics of the amplifier. Here, the characteristics of the amplifier include, for example, a distortion characteristic, error vector magnitude (EVM), efficiency, saturation power, and the like.

In this configuration, the adjustment of impedance is performed at the output matching circuit 30. This enables the amplifier circuit 1 to directly compensate the load impedance.

Second Embodiment

Figure 3:
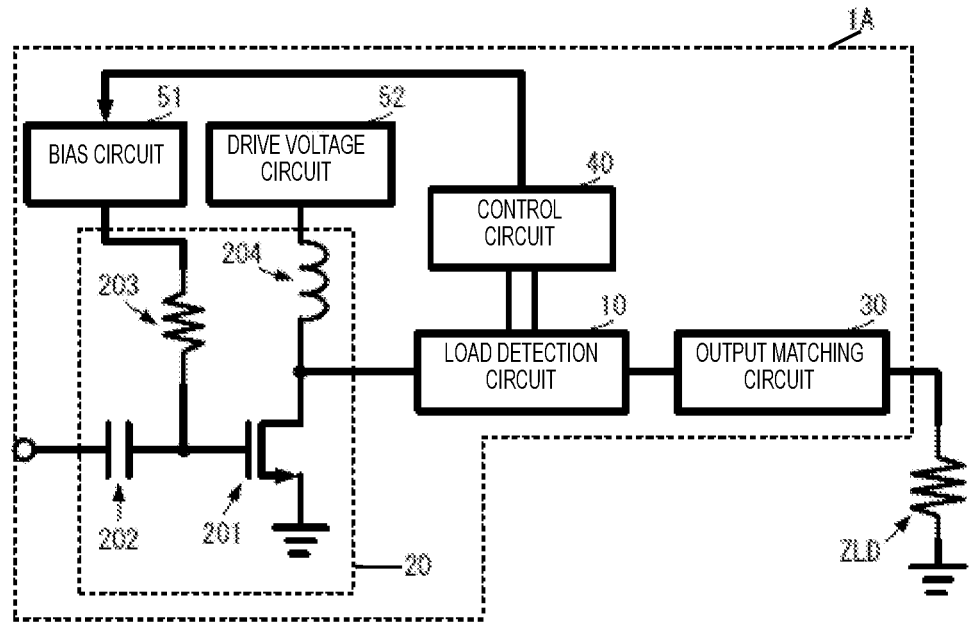
FIG. 3 is an equivalent circuit diagram of an amplifier circuit according to a second embodiment.

FIG. 3 is an equivalent circuit diagram of an amplifier circuit according to the second embodiment. As illustrated in FIG. 3, an amplifier circuit 1A according to the second embodiment is different from the amplifier circuit 1 according to the first embodiment in the object to be controlled by the control circuit 40. The other configuration of the amplifier circuit 1A is similar to that of the amplifier circuit 1, and the description regarding the similar part is omitted.

The amplifier circuit 1A includes a bias circuit 51 and a drive voltage circuit 52. As illustrated in FIG. 3, the RF amplifier 20 includes, for example, a FET 201, an input capacitor 202, a bias resistor 203, and a coil 204. A source of the FET 201 is connected to the ground. A gate of the FET 201 is connected to an input port for an RF signal via the input capacitor 202. The gate of the FET 201 is connected to the bias circuit 51 via the bias resistor 203. A drain of the FET 201 is connected to the drive voltage circuit 52 via the coil 204. The drain of the FET 201 is connected to the load detection circuit 10 through an output port of the RF amplifier 20.

The bias circuit 51 generates a bias voltage. The bias circuit 51 supplies a bias voltage to the gate of the FET 201 through the bias resistor 203. The drive voltage circuit 52 generates a drive voltage. The drive voltage circuit 52 supplies a drive voltage to the drain of the FET 201 through the coil 204.

The control circuit 40 controls the bias circuit 51 using the load impedance detection signal Sz. In other words, the control circuit 40 adjusts the bias voltage for the RF amplifier 20 using the load impedance detection signal Sz. The amplifier circuit 1A can adjust the characteristics of the RF amplifier 20 by adjusting the bias voltage, thereby enabling the indirect adjustment of the load impedance. That is to say, the amplifier circuit 1A can indirectly compensate the load impedance.

Third Embodiment

Figure 4:
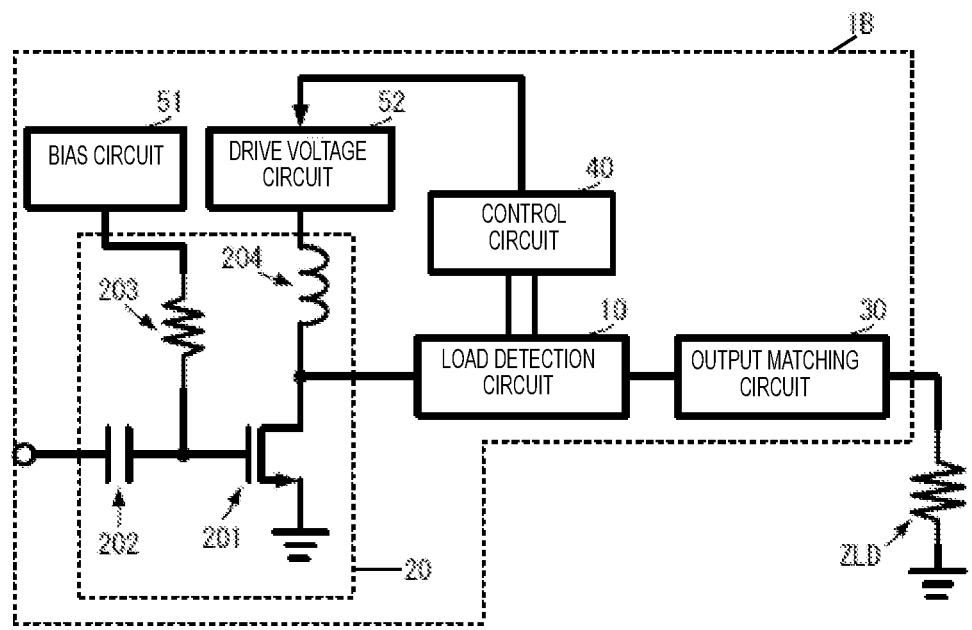
FIG. 4 is an equivalent circuit diagram of an amplifier circuit according to a third embodiment.

FIG. 4 is an equivalent circuit diagram of an amplifier circuit according to the third embodiment. As illustrated in FIG. 4, an amplifier circuit 1B according to the third embodiment is different from the amplifier circuit 1A according to the second embodiment in the object to be controlled by the control circuit 40. The other configuration of the amplifier circuit 1B is similar to that of the amplifier circuit 1A, and the description regarding the similar part is omitted.

The control circuit 40 controls the drive voltage circuit 52 using the load impedance detection signal Sz. In other words, the control circuit 40 adjusts the drive voltage for the RF amplifier 20 using the load impedance detection signal Sz. By adjusting the drive voltage, the amplifier circuit 1B can adjust the characteristics of the RF amplifier 20 and indirectly adjust the load impedance. That is to say, the amplifier circuit 1B can indirectly compensate the load impedance.

Fourth Embodiment

Figure 5:
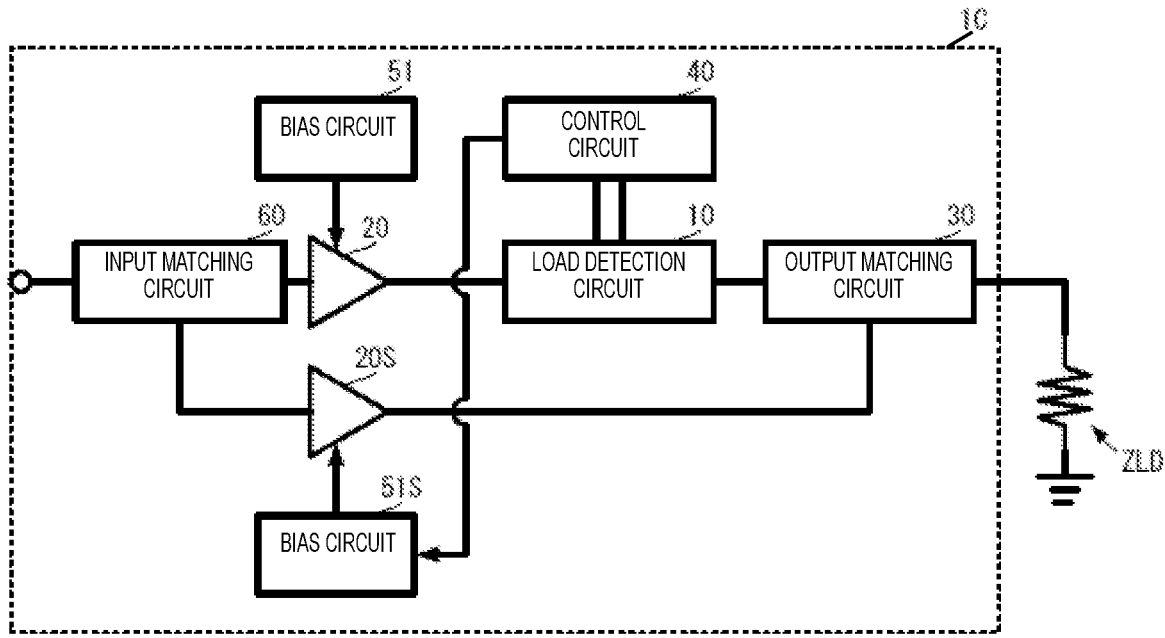
FIG. 5 is an equivalent circuit diagram of an amplifier circuit according to a fourth embodiment.

FIG. 5 is an equivalent circuit diagram of an amplifier circuit according to the fourth embodiment. As illustrated in FIG. 5, an amplifier circuit 1C according to the fourth embodiment is different from the amplifier circuit 1 according to the first embodiment in that an RF sub-amplifier 20S is included, the circuitry is changed because of the inclusion of the RF sub-amplifier 20S, and a different object is controlled by the control circuit 40. The other configuration of the amplifier circuit 1C is similar to that of the amplifier circuit 1, and the description regarding the similar part is omitted.

The amplifier circuit 1C includes the RF sub-amplifier 20S, a bias circuit 51S, and an input matching circuit 60.

The input matching circuit 60 is connected between an input port of the RF amplifier 20 and an input port of the amplifier circuit 1C for an RF signal.

The input port of the RF sub-amplifier 20S is connected to the input matching circuit 60, and an output port of the RF sub-amplifier 20S is connected to the output matching circuit 30. In other words, the RF sub-amplifier 20S is connected in parallel to the RF amplifier 20.

The bias circuit 51S supplies a bias voltage to the RF sub-amplifier 20S.

The control circuit 40 controls the bias circuit 51S using the load impedance detection signal Sz. In other words, the control circuit 40 adjusts the bias voltage for the RF sub-amplifier 20S using the load impedance detection signal Sz. The amplifier circuit 1C can adjust the characteristics of the RF sub-amplifier 20S by adjusting the bias voltage of the RF sub-amplifier 20S. In the amplifier circuit 1C, the load impedance depends on the characteristics of the RF amplifier 20 and the characteristics of the RF sub-amplifier 20S. Accordingly, the amplifier circuit 1C can indirectly adjust the load impedance. That is to say, the amplifier circuit 1C can indirectly compensate the load impedance.

Furthermore, in this configuration, there is no need to change the bias voltage or the drive voltage of the RF amplifier 20 that serves as a main amplifier.

Note that the present embodiment illustrates the mode in which the bias voltage of the RF sub-amplifier 20S is adjusted. However, the drive voltage of the RF sub-amplifier 20S may alternatively be adjusted.

Fifth Embodiment

Figure 6:
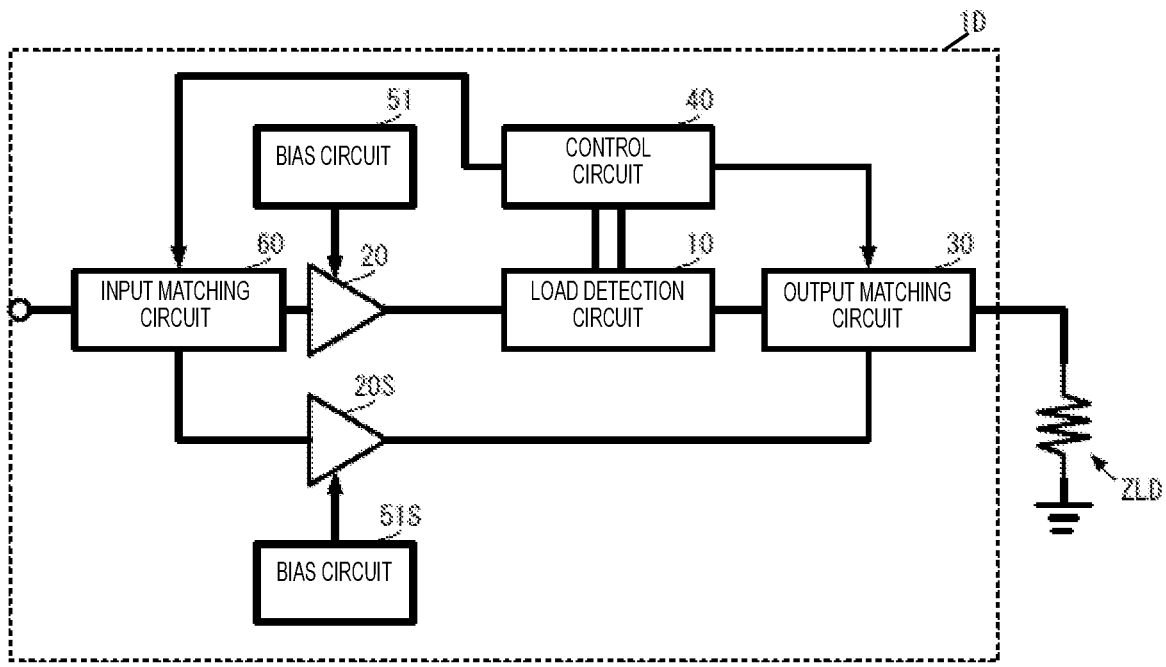
FIG. 6 is an equivalent circuit diagram of an amplifier circuit according to a fifth embodiment.

FIG. 6 is an equivalent circuit diagram of an amplifier circuit according to the fifth embodiment. As illustrated in FIG. 6, an amplifier circuit 1D according to the fifth embodiment is different from the amplifier circuit 1C according to the fourth embodiment in the object to be controlled by the control circuit 40. The other configuration of the amplifier circuit 1D is similar to that of the amplifier circuit 1C, and the description regarding the similar part is omitted.

The control circuit 40 controls at least one of the impedance of the output matching circuit 30 and the impedance of the input matching circuit 60 using the load impedance detection signal Sz. Even with such configuration and process, the amplifier circuit 1D can adjust and compensate the load impedance. Note that the amplifier circuit 1D does not necessarily include the input matching circuit 60 together with the RF sub-amplifier 20S, and may alternatively include only the input matching circuit 60.

Sixth Embodiment

Figure 7:
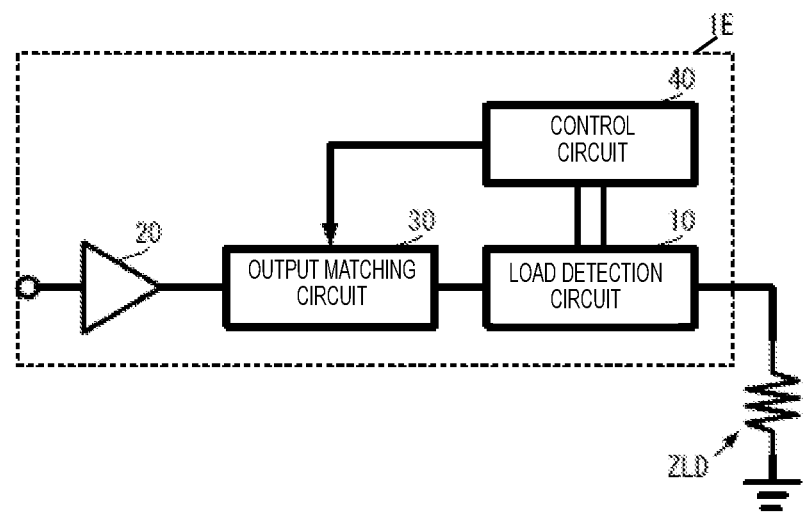
FIG. 7 is an equivalent circuit diagram of an amplifier circuit according to a sixth embodiment.

FIG. 7 is an equivalent circuit diagram of an amplifier circuit according to the sixth embodiment. As illustrated in FIG. 7, an amplifier circuit 1E according to the sixth embodiment is different from the amplifier circuit 1 according to the first embodiment in that the order of connection of the output matching circuit 30 and the load detection circuit 10 is inversed. The other configuration of the amplifier circuit 1E is similar to that of the amplifier circuit 1, and the description regarding the similar part is omitted.

In the amplifier circuit 1E, the output matching circuit 30 is connected to the output port of the RF amplifier 20, and the output matching circuit 30 is connected to the load ZLD via the load detection circuit 10.

Even with such configuration, the amplifier circuit 1E can adjust and compensate the load impedance. Furthermore, in this configuration, part to which the load detection circuit 10 is connected has a higher impedance than the output port of the RF amplifier 20. This facilitates the reduction of loss in the load detection circuit 10.

Seventh Embodiment

Figure 8:
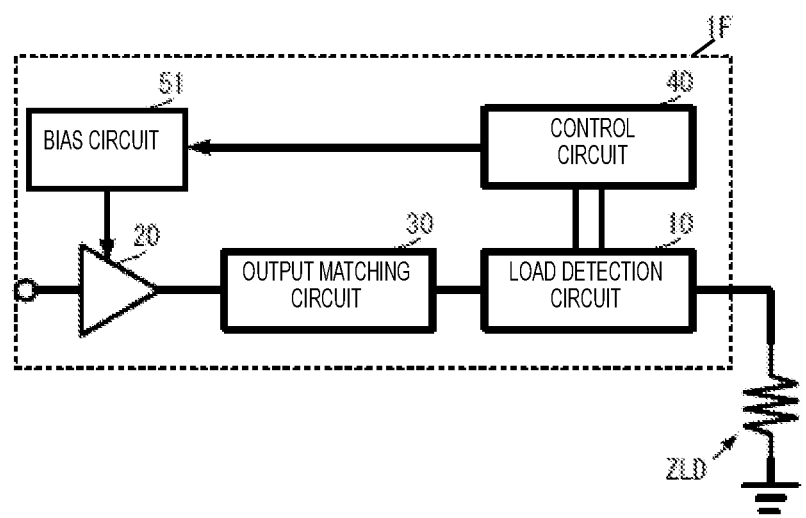
FIG. 8 is an equivalent circuit diagram of an amplifier circuit according to a seventh embodiment.

FIG. 8 is an equivalent circuit diagram of an amplifier circuit according to the seventh embodiment. As illustrated in FIG. 8, an amplifier circuit 1F according to the seventh embodiment is different from the amplifier circuit 1E according to the sixth embodiment in the object to be controlled by the control circuit 40. The other configuration of the amplifier circuit 1F is similar to that of the amplifier circuit 1E, and the description regarding the similar part is omitted.

In the amplifier circuit 1F, the control circuit 40 controls the bias circuit 51 for the RF amplifier 20 using the load impedance detection signal Sz. Even with such configuration, the amplifier circuit 1F can adjust and compensate the load impedance.

Eighth Embodiment

Figure 9:
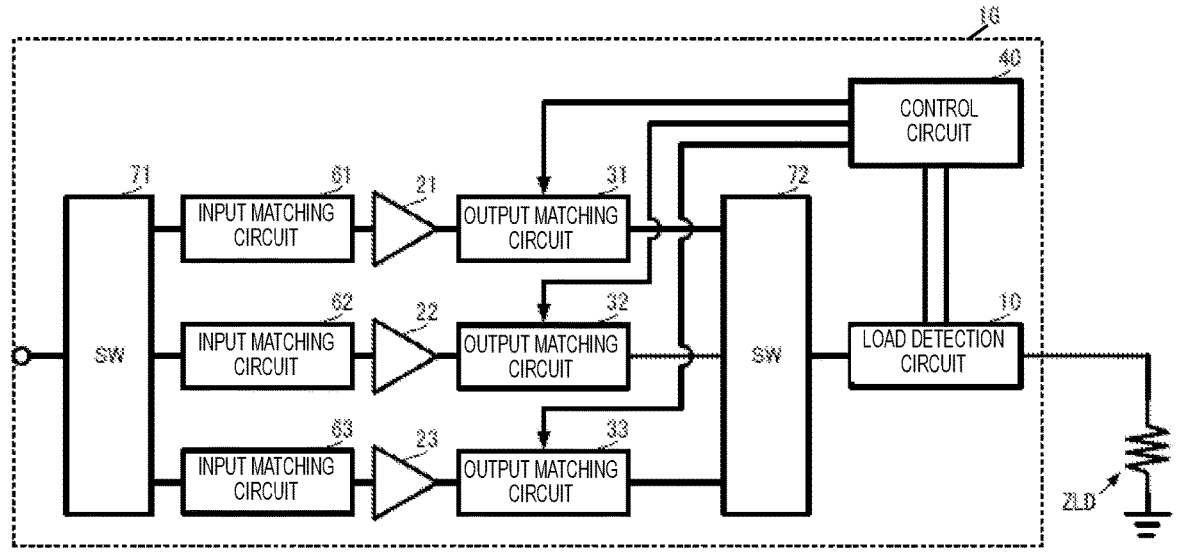
FIG. 9 is an equivalent circuit diagram of an amplifier circuit according to an eighth embodiment.

FIG. 9 is an equivalent circuit diagram of an amplifier circuit according to the eighth embodiment. As illustrated in FIG. 9, an amplifier circuit 1G according to the eighth embodiment is different from the amplifier circuit 1E according to the sixth embodiment in that a plurality of amplifier systems for RF signal is included. The other configuration of the amplifier circuit 1G is similar to that of the amplifier circuit 1E, and the description regarding the similar part is omitted.

The amplifier circuit 1G includes the load detection circuit 10, the control circuit 40, a plurality of RF amplifiers (a RF amplifier 21, an RF amplifier 22, and an RF amplifier 23), a plurality of output matching circuits (an output matching circuit 31, an output matching circuit 32, and an output matching circuit 33), a plurality of input matching circuits (an input matching circuit 61, an input matching circuit 62, and an input matching circuit 63), a switch circuit 71, and a switch 72.

An input port of the amplifier circuit 1G for RF signal is connected to the switch circuit 71. The switch circuit 71 is connected to the input matching circuit 61, the input matching circuit 62, and the input matching circuit 63. The switch circuit 71 selects one of the input matching circuit 61, the input matching circuit 62, and the input matching circuit 63 and connects the selected one to the input port of an RF signal.

The input matching circuit 61 is connected to an input port of the RF amplifier 21. An output port of the RF amplifier 21 is connected to the output matching circuit 31. The input matching circuit 62 is connected to an input port of the RF amplifier 22. An output port of the RF amplifier 22 is connected to the output matching circuit 32. The input matching circuit 63 is connected to an input port of the RF amplifier 23. An output port of the RF amplifier 23 is connected to the output matching circuit 33.

The output matching circuit 31, the output matching circuit 32, and the output matching circuit 33 are connected to the switch circuit 72. The switch circuit 72 is connected to the load detection circuit 10. The switch circuit 72 selects one of the output matching circuit 31, the output matching circuit 32, and the output matching circuit 33 and connects the selected one to the load detection circuit 10.

The switching of connection in the switch circuit 71 and the switching of connection in the switch circuit 72 are substantially synchronized. That is to say, when the switch circuit 71 selects the input matching circuit 61, the switch circuit 72 selects the output matching circuit 31. Similarly, when the switch circuit 71 selects the input matching circuit 62, the switch circuit 72 selects the output matching circuit 32, and when the switch circuit 71 selects the input matching circuit 63, the switch circuit 72 selects the output matching circuit 33.

The control circuit 40 controls the impedances of the output matching circuit 31, the output matching circuit 32, and the output matching circuit 33. Specifically, when the input matching circuit 61, the RF amplifier 21, and the output matching circuit 31 are selected and a first RF signal is amplified, the control circuit 40 controls the impedance of the output matching circuit 31. Similarly, when the input matching circuit 62, the RF amplifier 22, and the output matching circuit 32 are selected and a second RF signal is amplified, the control circuit 40 controls the impedance of the output matching circuit 32. When the input matching circuit 63, the RF amplifier 23, and the output matching circuit 33 are selected and a third RF signal is amplified, the control circuit 40 controls the impedance of the output matching circuit 33.

According to this configuration, the amplifier circuit 1G enables to amplify RF signals of plural kinds and compensate the load impedance for each of the RF signals. For example, even in the case where a plurality of RF signals is set in a frequency band that cannot be covered by a single RF amplifier, the amplifier circuit 1G can switch the RF amplifier for each RF signal and compensate the load impedance for each RF amplifier. In this configuration, there is no need to include the load detection circuit 10 for each RF amplifier, and thus the circuit configuration of the amplifier circuit 1G can be simplified.

Note that the objects to be controlled by the control circuit 40 in the embodiments described above may be combined. For example, the control circuit 40 may control the bias circuit and the drive voltage circuit. Alternatively, for example, the control circuit 40 may control the bias circuit and the output matching circuit 30.

Ninth Embodiment

Figure 10:
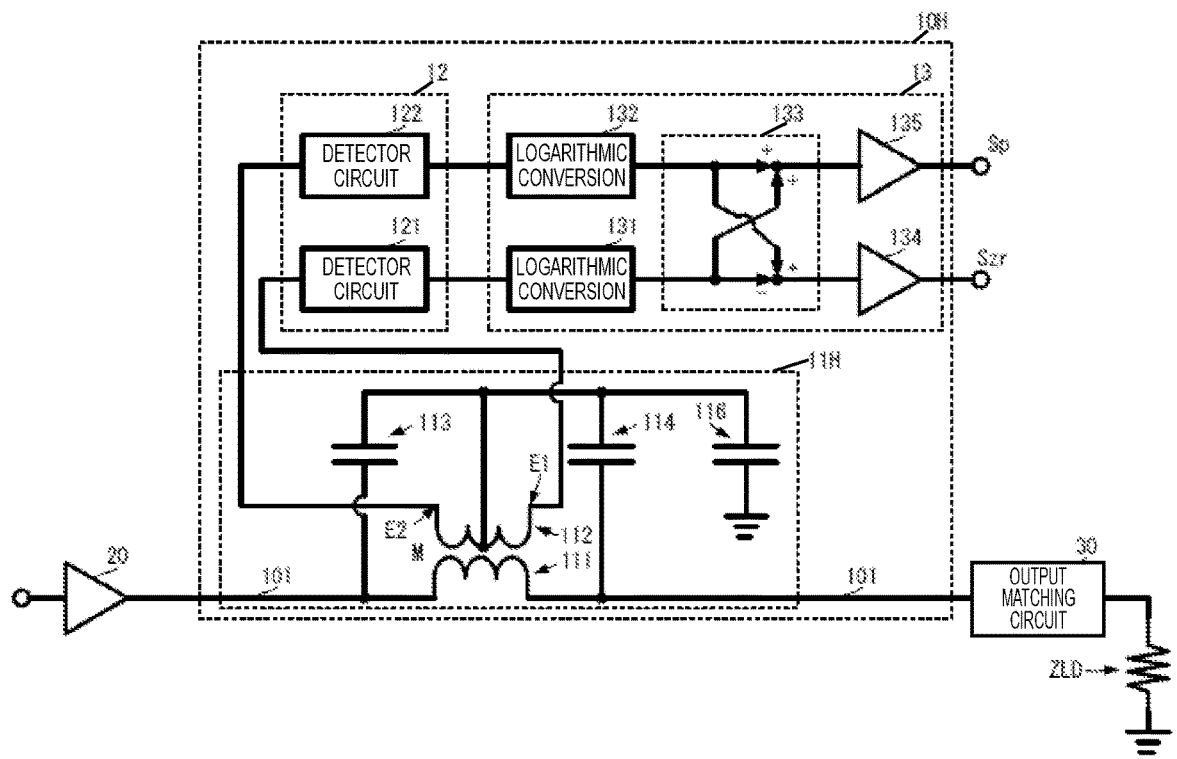
FIG. 10 is an equivalent circuit diagram of a load detection circuit according to a ninth embodiment.

FIG. 10 is an equivalent circuit diagram of a load detection circuit according to the ninth embodiment. As illustrated in FIG. 10, a load detection circuit 10H according to the ninth embodiment is different from the load detection circuit 10 according to the first embodiment in the configuration of a detection part 11H and a signal outputted from the detection part 11H. The other configuration of the load detection circuit 10H is similar to that of the load detection circuit 10, and the description regarding the similar part is omitted.

The load detection circuit 10H includes the detection part 11H. The detection part 11H includes an inductor 111, an inductor 112, a capacitor 113, a capacitor 114, and a capacitor 116.

The inductor 111 and the inductor 112 form an inductive coupling in such a manner as to have a mutual inductance M. The inductor 111 is connected between the output port of the RF amplifier 20 and the output matching circuit 30.

One end portion of the capacitor 113 and one end portion of the capacitor 114 are each connected to the signal transmission line 101. The other end portion of the capacitor 113 and the other end portion of the capacitor 114 are connected to each other, and a node of these other end portions is connected to the reference potential via the capacitor 116.

The node of the other end portion of the capacitor 113 and the other end portion of the capacitor 114 is connected to the inductor 112.

An end portion E1 of the inductor 112 on the load ZLD side is connected to the detector circuit 121 of the detector part 12. A first signal is outputted from the end portion E1 of the inductor 112. The end portion E1 of the inductor 112 on the load ZLD side is defined to mean an end portion of part where the inductor 112 forms inductive coupling with part of the inductor 111 on the side connected to the load ZLD (side connected to the output matching circuit 30).

An end portion E2 of the inductor 112 on the RF amplifier 20 side is connected to the detector circuit 122 of the detector part 12. A second signal is outputted from the end portion E2 of the inductor 112. The end portion E2 of the inductor 112 on the RF amplifier 20 side is defined to mean an end portion of part where the inductor 112 forms inductive coupling with part of the inductor 111 on the side connected to the RF amplifier 20.

In this configuration, a connecting part (node) between the inductor 112 and the capacitors 113 and 114 is connected to the reference potential via the capacitor 116. Therefore, although the phase difference between the voltage and the current in the signal transmission line 101 is 90 degrees, the phase difference between the voltages of the first signal and the second signal is 180 degrees.

The first signal and the second signal are signals in which a signal detected by the inductor 112 and signals detected by the capacitors 113 and 114 are overlapped. Accordingly, the first signal and the second signal depend on the magnitude and the sign of a reactance component of the load impedance.

Therefore, the signal outputted from the adder-subtractor 133, which is obtained by performing the subtraction operation on the first signal and the second signal, is a reactance detection signal Szr of the load impedance. This enables the load detection circuit 10H to accurately detect the reactance component of the load impedance.

Note that the configurations of the embodiments described above may be combined as needed, and the functions and effects corresponding to the combined configurations may be produced. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A load detection circuit comprising:
a first detection circuit that is capacitively coupled with a signal transmission line, and that is configured to output a first signal, the signal transmission line connecting an output port of a RF amplifier and a load;
a second detection circuit that is inductively coupled with the signal transmission line, and that is configured to output a second signal; and
an arithmetic circuit configured to generate a load impedance detection signal by performing a subtraction operation on the first signal and the second signal.

2. The load detection circuit according to claim 1, wherein the arithmetic circuit is further configured to generate a power detection signal by adding the first signal to the second signal together.

3. The load detection circuit according to claim 1, wherein the arithmetic circuit comprises logarithmic converters configured to logarithmically convert the first signal and the second signal.

4. The load detection circuit according to claim 1, further comprising:
detector circuits configured to detect the first signal and the second signal before the first signal and the second signal are input to the arithmetic circuit.

5. A load detection circuit comprising:
a first detection circuit that is capacitively coupled with a signal transmission line, the signal transmission line connecting an output port of a RF amplifier and a load; and
a second detection circuit that is inductively coupled with the signal transmission line, wherein:
the first detection circuit and the second detection circuit are connected to each other,
a first signal is output from the second detection circuit from a side of the second detection circuit that is closer to the load than to the output port of the RF amplifier, and
a second signal is output from the second detection circuit from a side of the second detection circuit that is closer to the output port of the RF amplifier than to the load.

6. An amplifier circuit comprising:
the load detection circuit according to claim 1;
the RF amplifier;
an output matching circuit; and
a control circuit to which the load impedance detection signal is input,
wherein the control circuit is configured to control an impedance of the output matching circuit using the load impedance detection signal.

7. The amplifier circuit according to claim 6, further comprising:
an input matching circuit connected to an input port of the RF amplifier, wherein the control circuit is configured to control an impedance of the input matching circuit using the load impedance detection signal.

8. The amplifier circuit according to claim 7, further comprising:
a RF sub-amplifier connected in parallel to the RF amplifier, wherein:
the input matching circuit is further connected to an input port of the RF sub-amplifier, and
the control circuit is further configured to control the impedance of the input matching circuit using the load impedance detection signal.

9. An amplifier circuit comprising:
the load detection circuit according to claim 1;
the RF amplifier;
an output matching circuit; and
a control circuit to which the load impedance detection signal is input,
wherein the control circuit is configured to control a drive condition of the RF amplifier using the load impedance detection signal.

10. The amplifier circuit according to claim 9, wherein the control circuit is configured to control, as the drive condition, a bias voltage of the RF amplifier.

11. The amplifier circuit according to claim 9, wherein the control circuit is configured to control, as the drive condition, a drive voltage of the RF amplifier.

12. The amplifier circuit according to claim 9, further comprising:
a RF sub-amplifier connected in parallel to the RF amplifier, wherein the control circuit is further configured to control a drive condition of the RF sub-amplifier using the load impedance detection signal.

13. An amplifier circuit comprising:
the load detection circuit according to claim 1;
the RF amplifier;
a RF sub-amplifier connected in parallel to the RF amplifier;
an output matching circuit; and
a control circuit to which the load impedance detection signal is input,
wherein the control circuit is configured to control a drive condition of the RF sub-amplifier using the load impedance detection signal.

14. The amplifier circuit according to claim 6, wherein the load detection circuit is connected between the RF amplifier and the output matching circuit.

15. The amplifier circuit according to claim 6, wherein the load detection circuit is connected between the output matching circuit and the load.

16. The amplifier circuit according to claim 9, wherein the load detection circuit is connected between the RF amplifier and the output matching circuit.

17. The amplifier circuit according to claim 9, wherein the load detection circuit is connected between the output matching circuit and the load.

* * * * *